United States Patent
Lee et al.

(10) Patent No.: US 11,183,634 B2
(45) Date of Patent: Nov. 23, 2021

(54) ELECTRONIC DEVICE AND METHOD OF MANUFACTURING ELECTRONIC DEVICE

(71) Applicant: SK hynix Inc., Icheon (KR)

(72) Inventors: Woo Tae Lee, Seoul (KR); Beom Seok Lee, Suwon (KR)

(73) Assignee: SK hynix Inc., Icheon (KR)

( * ) Notice: Subject to any disclaimer, the term of this patent is extended or adjusted under 35 U.S.C. 154(b) by 62 days.

(21) Appl. No.: 16/711,286

(22) Filed: Dec. 11, 2019

(65) Prior Publication Data

US 2021/0013409 A1 Jan. 14, 2021

(30) Foreign Application Priority Data

Jul. 12, 2019 (KR) .......................... 10-2019-0084761

(51) Int. Cl.
| | |
|---|---|
| H01L 45/00 | (2006.01) |
| H01L 27/22 | (2006.01) |
| H01L 43/02 | (2006.01) |
| H01L 43/12 | (2006.01) |
| H01L 27/24 | (2006.01) |

(52) U.S. Cl.
CPC ............ *H01L 45/16* (2013.01); *H01L 27/224* (2013.01); *H01L 27/2409* (2013.01); *H01L 43/02* (2013.01); *H01L 43/12* (2013.01); *H01L 45/1253* (2013.01)

(58) Field of Classification Search
CPC ... H01L 45/16; H01L 27/224; H01L 27/2409; H01L 43/02; H01L 43/12; H01L 45/1253
USPC .......................................................... 438/4
See application file for complete search history.

(56) References Cited

U.S. PATENT DOCUMENTS

| | | |
|---|---|---|
| 8,486,743 B2 | 7/2013 | Bresolin et al. |
| 8,530,875 B1 | 9/2013 | Chang et al. |
| 2011/0193049 A1* | 8/2011 | Iwakaji ............... H01L 27/1021 257/4 |
| 2015/0053908 A1* | 2/2015 | Fowler ................ H01L 45/1641 257/4 |
| 2019/0103467 A1* | 4/2019 | Takaki .................. H01L 27/249 |

* cited by examiner

*Primary Examiner* — Jami Valentine Miller

(57) ABSTRACT

A method of manufacturing an electronic device including a semiconductor memory may include forming a first active layer, forming a first electrode material over the first active layer, performing a heat treatment process on the first electrode material and the first active layer, and forming a second electrode material over the heat-treated first electrode material.

32 Claims, 19 Drawing Sheets

ELECTRONIC DEVICE AND METHOD OF MANUFACTURING ELECTRONIC DEVICE

CROSS-REFERENCE TO RELATED APPLICATION

The present application claims priority under 35 U.S.C. § 119(a) to Korean patent application number 10-2019-0084761, filed on Jul. 12, 2019, in the Korean Intellectual Property Office, the entire disclosure of which is incorporated herein by reference.

BACKGROUND

1. Technical Field

The present disclosure relates to an electronic device, and more particularly, to an electronic device including a semiconductor memory and a method of manufacturing the electronic device.

2. Related Art

In recent years, a semiconductor device capable of storing information in various electronic devices such as a computer and a portable communication device has been developed, according to miniaturization, low power consumption, high performance, and diversification of an electronic device. Therefore, study on a semiconductor device capable of storing data by using a switching characteristic between different resistance states according to an applied voltage or current. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

Embodiments of the present disclosure relate to an electronic device and a method of manufacturing an electronic device capable of improving an operation characteristic and reliability of a memory cell.

A method of manufacturing an electronic device including a semiconductor memory according to an embodiment of the present disclosure may include forming a first active layer, forming a first electrode material over the first active layer, performing a heat treatment process on the first electrode material and the first active layer, and forming a second electrode material over the heat-treated first electrode material.

An electronic device according to an embodiment of the present disclosure may include a semiconductor memory. The semiconductor memory may include a first electrode, a second electrode including a plurality of conductive layers, and a first active layer interposed between the first electrode and the second electrode, wherein the plurality of conductive layers of the second electrode include a first conductive layer that is in contact with the first active layer, the first conductive layer having a thickness in a range from 10 Å to 100 Å.

An operation characteristic and reliability of a memory cell according to an embodiment of the present disclosure may be improved.

DETAILED DESCRIPTION

Figure 1A:
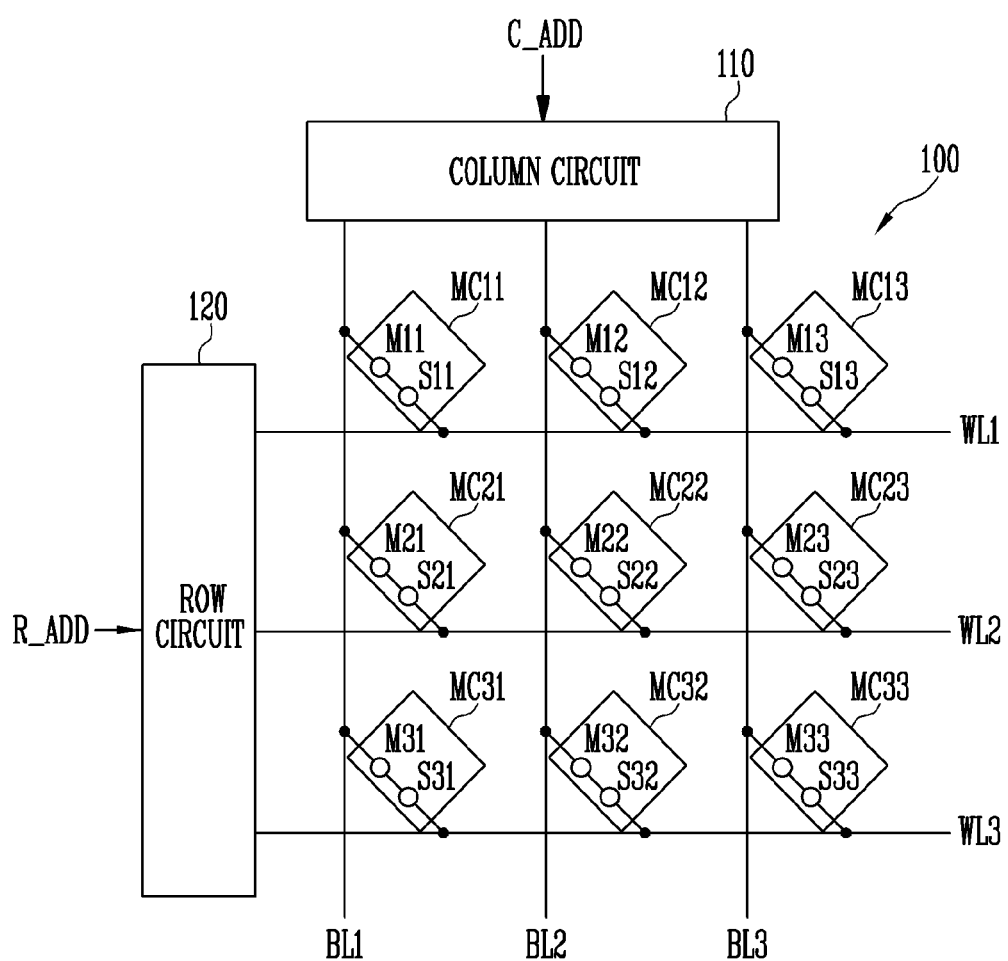
FIGS. 1A and 1B are diagrams illustrating a structure of an electronic device according to an embodiment of the present disclosure.

Hereinafter, various embodiments are described in detail with reference to the accompanying drawings.

The drawings are not necessarily drawn in a fixed ratio, and in some examples, proportions of at least some of the structures shown in the drawings may be exaggerated to clearly show a characteristic of the embodiments. When a multi-layer structure having two or more layers is disclosed in the drawings or the detailed description, a spatial relationship or arrangement order of the layers as shown merely reflect a specific example and embodiments of the present disclosure are not limited thereto. The spatial relationship or arrangement order of the layers may vary. In addition, a drawing or a detailed description of a multi-layer structure may not reflect all layers present in a specific multi-layer structure (for example, there may be more than one additional layer between shown two layers). For example, when a first layer is present on a second layer or a substrate in the multi-layer structure of the drawings or the detailed description, the first layer may be formed directly on the second layer or directly on the substrate, and one or more other layers may be present between the first layer and the second layer or between the first layer and the substrate.

Figure 1B:
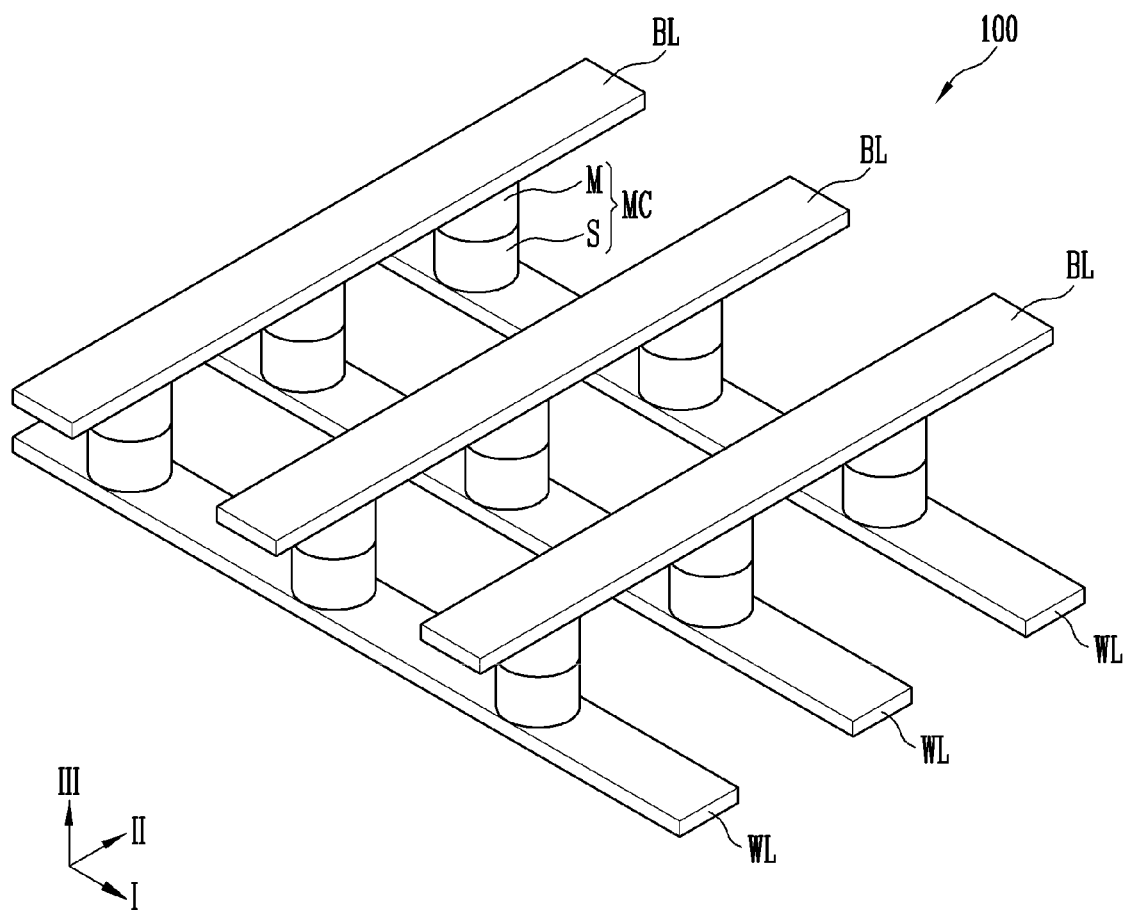

FIGS. 1A and 1B are diagrams illustrating a structure of an electronic device according to an embodiment of the present disclosure. FIG. 1A is a circuit diagram of a cell array 100 and FIG. 1B is a perspective view of the memory cell array 100.

Referring to FIG. 1A, the electronic device according to an embodiment of the present disclosure may include a semiconductor memory (or a semiconductor device), and the semiconductor memory may be a non-volatile memory device or a variable resistance memory device. The semiconductor memory may include a plurality of row lines and a plurality of column lines intersecting the row lines. Here, the row lines may be word lines, and the column lines may be bit lines. For reference, the word line and bit line are relative concepts, and the row lines may be bit lines and the column lines may be word lines. Hereinafter, it is assumed that the row lines are word lines and the column lines are bit lines.

The cell array 100 may include memory cells MC11 to MC33 disposed between the column lines BL1 to BL3 and the row lines WL1 to WL3, respectively. Here, the memory cells MC11 to MC33 may be disposed at respective points where the column lines BL1 to BL3 and the row lines WL1 to WL3 intersect. Each of the memory cells MC11 to MC33 may include at least one of selection elements S11 to S33 and memory elements M11 to M33 connected in series. The selection elements S11 to S33 may be electrically connected to the row lines WL1 to WL3, and the memory elements M11 to M33 may be electrically connected to the column lines BL1 to BL3.

The memory elements M11 to M33 may each include a memory pattern as a storage node for storing data. For example, the memory elements M11 to M33 may include a variable resistance material such as a resistive material, a magnetic tunnel junction (MTJ), a phase change material, and the like.

The selection elements S11 to S33 each are configured for selecting a memory cell MC and may include a switching material. The selection elements S11 to S33 may be a diode, a PNP diode, a BJT, a metal insulator transition (MIT) device, a mixed ionic-electronic conduction (MIEC) device, an OTS device, or the like.

For reference, a shape and a configuration of each of the memory cells MC11 to MC33 may vary according to embodiments. For example, the selection elements S11 to S33 may be omitted, or the memory elements M11 to M33 may be omitted. Alternatively, positions of the selection elements S11 to S33 and the memory elements M11 to M33 may be reversed. In this case, each of the selection elements S11 to S33 may be electrically connected to a corresponding one of the column lines BL1 to BL3, and each of the memory elements M11 to M33 may be electrically connected to a corresponding one of the row lines WL1 to WL3.

In addition, the semiconductor memory may further include a column circuit 110 for controlling the column lines BL1 to BL3 and a row circuit 120 for controlling the row lines WL1 to WL3.

The row circuit 120 may be a row decoder, a word line decoder, a word line driver, or the like. The row circuit 120 selects a single row line (e.g., the second row line WL2) from the row lines WL1 to WL3 according to a row address R_ADD. The column circuit 110 may be a column decoder, a bit line decoder, a bit line driver, or the like. The column circuit 110 selects a single column line (e.g., the second column line BL2) from the column lines BL1 to BL3 according to a column address C_ADD. Therefore, a single memory cell (e.g., the memory cell MC22) connected between the selected column line BL2 and the selected row line WL2 may be selected.

For reference, FIG. 1A shows three column lines BL1 to BL3 and three row lines WL1 to WL3, but this is merely for convenience of description, and embodiments of the present disclosure are not limited thereto. For example, the number of the column lines BL1 to BL3 and that of the row lines WL1 to WL3 included in the cell array 100 may vary according to embodiments.

Referring to FIG. 1B, the memory cell array 100 may include column lines BL and row lines WL positioned at different levels. The column lines BL may be positioned over the row lines WL or under the row lines WL. The row lines WL may each extend in a first direction I and the column lines BL may each extend in a second direction II intersecting the first direction I.

The memory cells MC may be disposed at respective intersection points of the column lines BL and the row lines WL. Each of the memory cells MC1 and MC2 may be a stack and may include one or both of a memory element M and a selection element S stacked in a third direction III. Here, the third direction III is a direction intersecting the first direction I and the second direction II, and may be a direction perpendicular to a plane defined by the first direction I and the second direction II.

The column lines BL, the memory cells MC, and the row lines WL may form one deck. Although the cell array 100 has a single-deck structure in FIG. 1B, embodiments of the present disclosure are not limited thereto, and one or more decks may be further included. The cell array 100 may have a multi-deck structure in which the row lines and the column lines are alternately stacked in a third direction III. In the multi-deck structure, the stacked decks may share the row lines WL or the column lines BL.

Figure 2A:
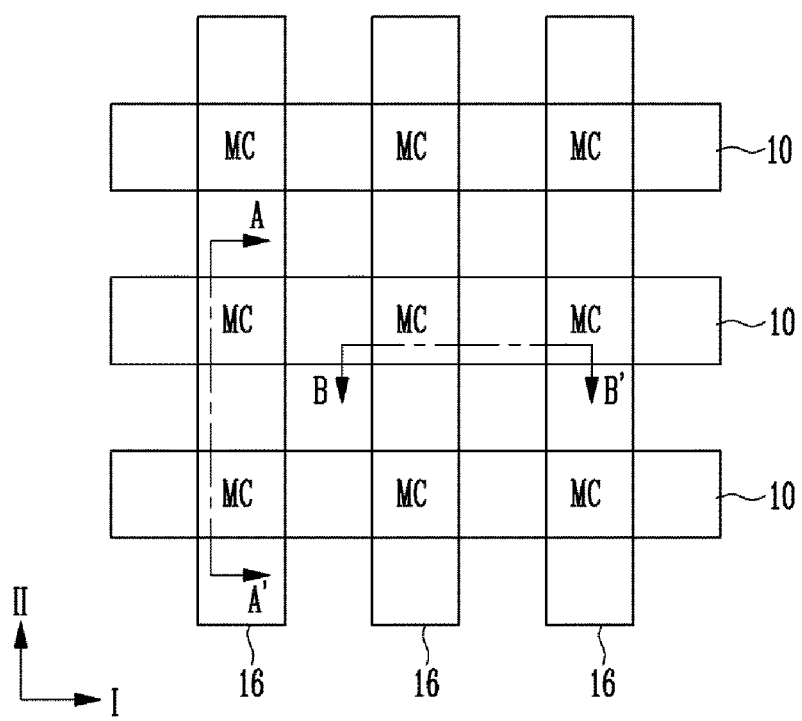
FIGS. 2A, 2B, and 2C are diagrams illustrating a structure of an electronic device according to an embodiment of the present disclosure.
Figure 2B:
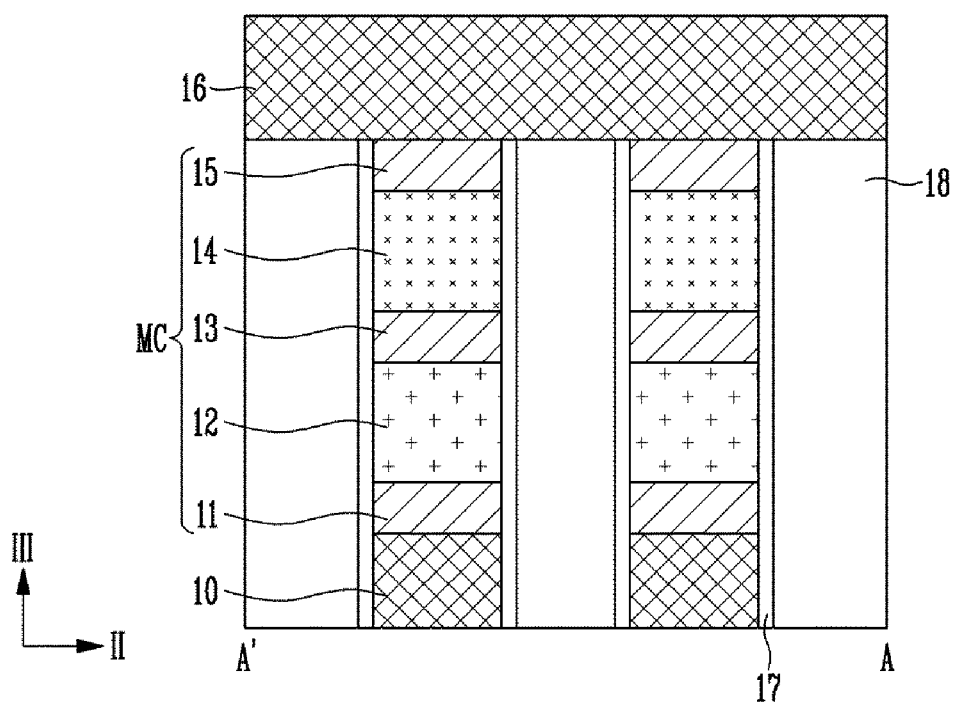
Figure 2C:
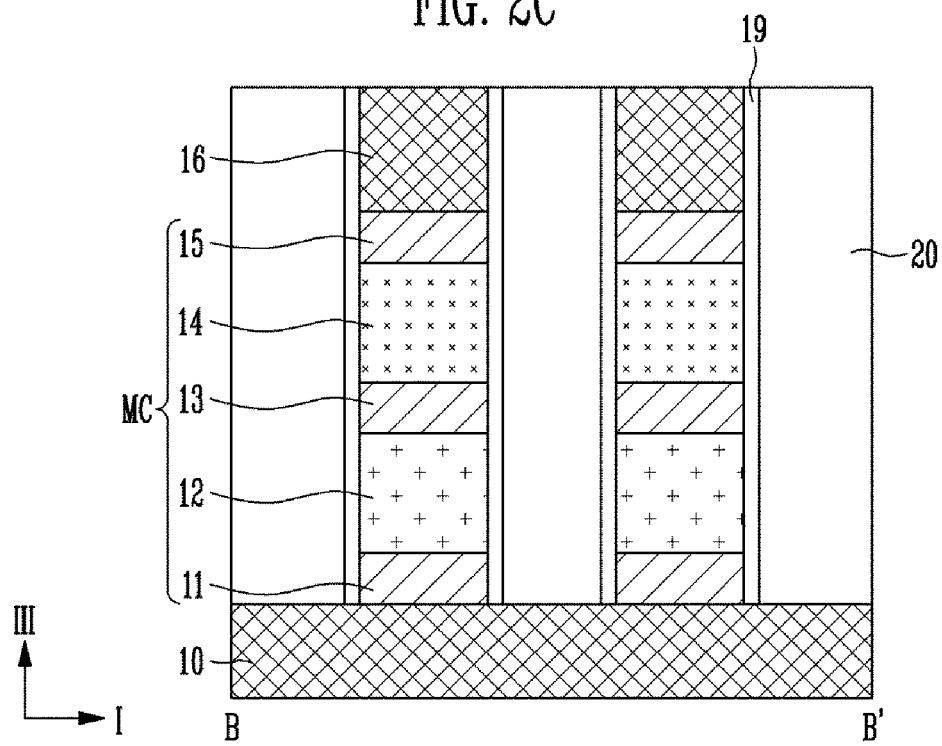

FIGS. 2A, 2B, and 2C are diagrams illustrating a structure of an electronic device according to an embodiment of the present disclosure. FIG. 2A is a layout, FIG. 2B is a cross-sectional view along a first line A-A' of FIG. 2A, and FIG. 2C is a cross-sectional view along a second line B-B' of FIG. 2A.

Referring to FIGS. 2A to 2C, the electronic device according to an embodiment of the present disclosure may include row lines 10, column lines 16, and memory cells MC. In addition, the electronic device may further include a first protective layer 17, a second protective layer 19, first insulating layers 18, and a second insulating layer 20.

Each of the memory cells MC may include at least one of a first electrode 11, a second electrode 13, a third electrode 15, a first active layer interposed between the first electrode 11 and the second electrode 13, and a second active layer interposed between the second electrode 13 and the third electrode 15. The first active layer may be configured as a switching layer 12 and the second active layer may be configured as a variable resistance layer 14.

The variable resistance layer 14 may have a characteristic of reversibly switching between different resistance states according to an applied voltage or current. Therefore, when the variable resistance layer 14 has a first resistance state (e.g., a low resistance state), a first logic value (e.g., data '1') may be stored, and when the variable resistance layer 14 has a second resistance state (e.g., a high resistance state), a second logic value (e.g., data '0') may be stored.

When the variable resistive layer 14 is a resistive material, the variable resistive layer 14 may include a transition metal oxide or may include a metal oxide such as a perovskite based material. Therefore, an electrical path is generated or extinguished in the variable resistive layer 14, and thus data may be stored.

When the variable resistance layer 14 has an MTJ structure, the variable resistance layer 14 may include a magnetization pinned layer, a magnetization free layer, and a tunnel barrier layer interposed therebetween. For example, the magnetization pinned layer and the magnetization free layer may include a magnetic material, and the tunnel barrier layer may include an oxide such as magnesium (Mg), aluminum (Al), zinc (Zn), or titanium (Ti). Here, a magnetization direction of the magnetization free layer may be changed by a spin torque of electrons in an applied current. Therefore, data may be stored according to the change in the magnetization direction of the magnetization free layer with respect to a magnetization direction of the magnetization pinned layer.

When the variable resistance layer 14 is a phase change material, the variable resistance layer 14 may include a chalcogenide based material. The variable resistance layer 14 may include silicon (Si), germanium (Ge), antimony (Sb), tellurium (Te), bismuth (Bi), indium (In), tin (Sn), selenium (Se), or the like, or a combination thereof, as the chalcogenide based material. For example, the variable resistance layer 14 may be Ge—Sb—Te (GST), and may be $Ge_2Sb_2Te_5$, $Ge_2Sb_2Te_7$, $Ge_1Sb_2Te_4$, $Ge_1Sb_4Te_7$, and the like. Here, a chemical composition ratio of the variable resistance layer 14 may be determined in consideration of characteristics such as a melting point and a crystallization temperature, and the variable resistance layer 14 may further include an impurity such as carbon (C) and nitrogen (N). The phase change material has a low resistance characteristic in a crystalline state and a high resistance characteristic in an amorphous state. Therefore, the memory cell MC may store data by a set operation that changes from a high resistance amorphous state to a low resistance crystalline state and a reset operation that changes from a low resistance crystalline state to a high resistance amorphous state.

The switching layer 12 may be a selection element that adjusts a current flow according to a magnitude of an applied voltage or current. When the magnitude of the voltage or current applied to the switching layer 12 is equal to or less than a threshold value, a current hardly flows through the switching layer 12. When the magnitude of the voltage or current applied to the switching layer 12 is greater than exceeds the threshold value, a rapidly increased amount of current flows through the switching layer 12. The amount of increased current may be substantially proportional to the magnitude of the applied voltage or current.

When the switching layer 12 is a metal insulator transition (MIT) element, the switching layer 12 may include $VO_2$, $NbO_2$, $TiO_2$, $WO_2$, $TiO_2$, or the like. When the switching layer 12 is a mixed ion-electron conducting (MIEC) element, the switching layer 12 may include $ZrO_2(Y_2O_3)$, $Bi_2O_3$—BaO, $(La_2O_3)x(CeO_2)_{1-x}$, or the like. In addition, when the switching layer 12 is an ovonic threshold switching (OTS) element, the switching layer 12 may include Te, Se, Ge, Si, As, Ti, S, Sb, or the like. For example, the switching layer 12 may include a chalcogenide based material such as $As_2Te_3$, $As_2$, or $As_2Se_3$.

The first electrode 11 may be electrically connected to the row line 10. The second electrode 13 may be interposed between the switching layer 12 and the variable resistance layer 14. The third electrode 15 may be electrically connected to the column line 16. The first electrode 11, the second electrode 13, and the third electrode 15 may include a conductive material such as carbon, metal, or metal nitride. Each of the first electrode 11, the second electrode 13, and the third electrode 15 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), or the like, or may include any combination thereof. For example, at least one of the first electrode 11, the second electrode 13, and the third electrode 15 may be a carbon electrode.

Each of the first electrode 11, the second electrode 13, and the third electrode 15 may have a single layer structure or a multi-layer structure. When the electrode has a multi-layer structure, the electrode may include a stack of conductive layers. In addition, among the conductive layers, a conductive layer (e.g., a heat-treated first electrode material 43A in FIG. 4D or 75A in FIG. 7D) that is in contact with the switching layer 12 or the variable resistive layer 14 may have a thickness in a range from 10 Å to 100 Å. In addition, each (e.g., a second electrode material 54 in FIG. 5B) of the conductive layers included in the electrode 11, 13, or 15 may have a thickness in a range from 10 Å to 100 Å. The first electrode 11, the second electrode 13, and the third electrode 15 may have substantially the same thickness or different thicknesses.

The first protective layer 17 and the second protective layer 19 are for protecting stack layers in a manufacturing process. The first protective layer 17 and the second protective layer 19 may be formed of a non-conductive material, and may include oxide, nitride, polysilicon, or the like. For example, the first protective layer 17 and the second protective layer 19 may include silicon oxide (SiO), silicon nitride ($Si_3N_4$), polysilicon, titanium nitride (TiN), tantalum nitride, or the like, or a combination thereof. In addition, each of the first protective layer 17 and the second protective layer 19 may have a single layer structure or a multi-layer structure.

The first protective layer 17 may be formed to surround sidewalls facing in a second direction II of the memory cell MC and may extend in a first direction I. The second protective layer 19 may be formed to surround sidewalls facing in the first direction I of the memory cell MC and may extend in the second direction II. The second protective layer 19 may be formed partially or substantially entirely on the sidewalls of the memory cells MC.

The first insulating layer 18 and the second insulating layer 20 may be formed between adjacent memory cells MC, and may be formed to fill a space between the adjacent memory cells MC. Here, the first insulating layer 18 may fill a space between the memory cells MC that are adjacent to each other in the second direction II. The second insulating layer 20 may fill a space between the memory cells MC that are adjacent to each other in the first direction I. For example, the first insulating layers 18 and the second insulating layer 20 may include oxide such as silicon oxide ($SiO_2$), a fluid oxide layer such as spin on coating (SOC) or spin on dielectric (SOD), or a combination thereof.

According to the structure as described above, a degree of integration of the memory element may be improved by arranging the memory cells MC in a cross-point array structure. In addition, by forming at least one of the first electrode 11, the second electrode 13, and the third electrode 15 in a multi-layer structure, damage to the switching layer 12, or the variable resistance layer 15, or both may be recovered. For example, the number of voids formed in the switching layer 12, or the variable resistance layer 15, or both may be reduced, a size of the voids may be reduced, or the voids may be substantially removed. Thus, thermal stability in a fabrication process of the memory cells MC as well as various device characteristics may be improved. For example, in the electronic device according to an embodiment of the present disclosure, a leakage current may be reduced, a reduction of a threshold voltage may be prevented, a drift (e.g., a threshold voltage drift) may be reduced, and endurance (e.g., a changed amount of a threshold voltage with a number of programming pulses) may be improved compared to a conventional device.

FIGS. 3A to 3F are diagrams illustrating a structure of an electronic device according to an embodiment of the present disclosure. Hereinafter, descriptions repetitive to the above description will be omitted.

Figure 3A:
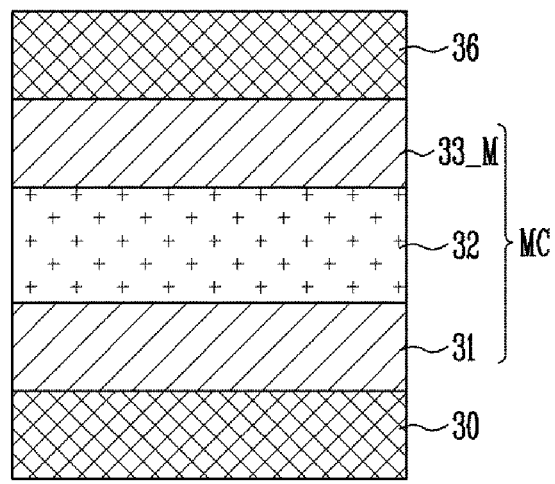
FIGS. 3A, 3B, 3C, 3D, 3E, and 3F are diagrams illustrating a structure of an electronic device according to an embodiment of the present disclosure.

Referring to FIG. 3A, a memory cell MC is positioned between a row line 30 and a column line 36. The memory cell MC includes a first electrode 31, a second electrode 33_M, and an active layer interposed between the first electrode 31 and the second electrode layer 33_M. The active layer may be configured as a switching layer 32. The switching layer 32 may be interposed between the first electrode 31 and the second electrode 33_M. In addition, at least one of the first electrode 31 and the second electrode 33_M may be in direct contact with the switching layer 32.

At least one of the first electrode 31 and the second electrode 33_M may include a stack of conductive layers. For example, one of the first electrode 31 and the second electrode 33_M, which is formed after forming the switching layer 32 may include the stack of conductive layers. In an embodiment, an electrode formed on the switching layer 32 may include the stack of conductive layers.

In the embodiment of FIG. 3A, it is assumed that the second electrode 33_M includes the stack of conductive layers. The second electrode 33_M may be formed to be in direct contact with the switching layer 32. In addition, the second electrode 33_M may be formed by alternately repeating an electrode material deposition process and a heat treatment process. For example, the second electrode 33_M may include a plurality of conductive layers, and each of the plurality of conductive layers is formed by depositing an electrode material layer and then performing a heat treatment process on the deposited electrode material layer. Among the conductive layers, a conductive layer that is in contact with the switching layer 32 may have a thickness in a range from 10 Å to 100 Å.

Figure 3B:
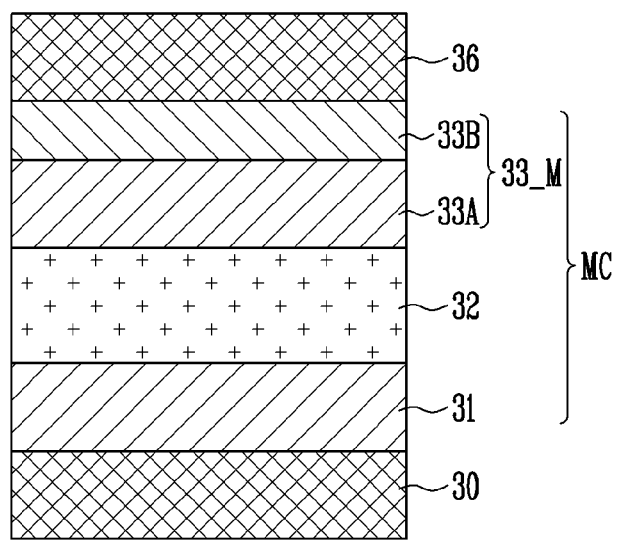

Referring to FIG. 3B, the memory cell MC includes a first electrode 31, a switching layer 32, and a second electrode 33_M. The second electrode 33_M may have a multi-layer structure and may include a first sub-electrode 33A and a second sub-electrode 33B. The first sub-electrode 33A may be in direct contact with the switching layer 32 and may include a stack of conductive layers. For example, the first sub-electrode 33A may be formed by alternately repeating an electrode material deposition process and a heat treatment process. Among the conductive layers included in the first sub-electrode 33A, a conductive layer that is in contact with the switching layer 32 may have a thickness in a range from about 10 Å to about 100 Å.

At an interface between the first sub-electrode 33A and the second sub-electrode 33B, a surface of the first sub-electrode 33A may be an etched surface. The second sub-electrode 33B may have a single layer structure. For example, the second sub-electrode 33B may be formed by depositing an electrode material on the etched surface of the first sub-electrode 33A.

In another embodiment, the memory cell MC may include a variable resistance layer (not shown) instead of the switching layer 32. In this case, the second electrode 33_M may be formed to be in direct contact with the variable resistance layer. In addition, among the conductive layers, a conductive layer that is in contact with the variable resistance layer may have a thickness in a range from 10 Å to 100 Å.

Figure 3C:
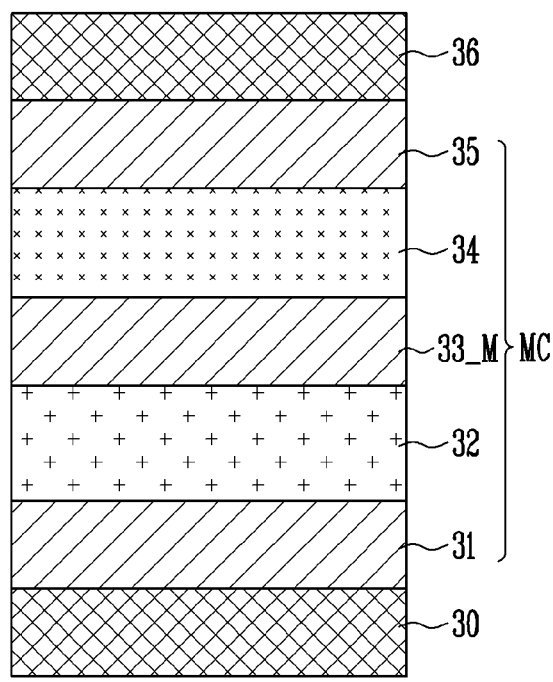

Referring to FIG. 3C, the memory cell MC includes a first electrode 31, a second electrode 33_M, a third electrode 35, a first active layer interposed between the first electrode 31 and a second electrode 33_M, and a second active layer interposed between the second electrode 33_M and a third electrode 35. The first active layer may be configured as a switching layer 32 and the second active layer may be configured as a variable resistance layer 34. The switching layer 32 may be interposed between the first electrode 31 and the second electrode 33_M. The variable resistive layer 34 may be interposed between the second electrode 33_M and the third electrode 35. The second electrode 33_M may be in direct contact with the switching layer 32 and may include a stack of conductive layers. Among the conductive layers included in the second electrode 33_M, a conductive layer that is in contact with the switching layer 32 may have a thickness in a range from 10 Å to 100 Å.

Figure 3D:
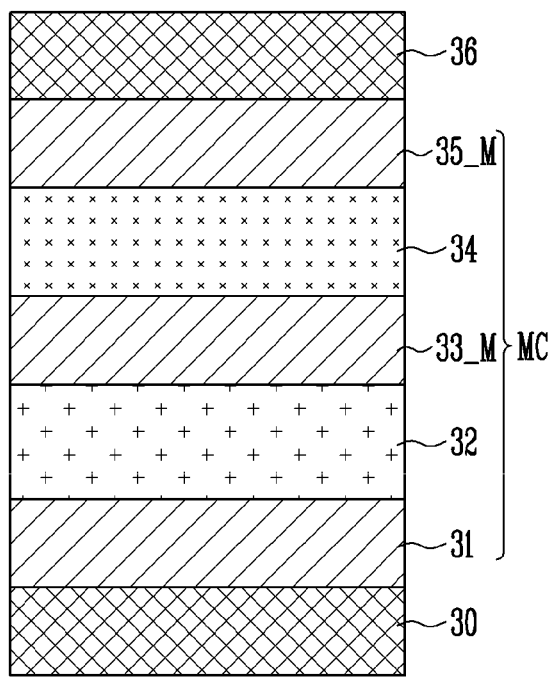

Referring to FIG. 3D, the memory cell MC includes a first electrode 31, a switching layer 32, a second electrode 33_M, a variable resistance layer 34, and a third electrode 35_M. The second electrode 33_M may be in direct contact with the switching layer 32 and may include a stack of conductive layers. Among the conductive layers included in the second electrode 33_M, a conductive layer that is in contact with the switching layer 32 may have a thickness in a range from 10 Å to 100 Å. The third electrode 35_M may be in direct contact with the variable resistance layer 34 and may include a stack of conductive layers. Among the conductive layers included in the third electrode 35_M, a conductive layer that is in contact with the variable resistance layer 34 may have a thickness in a range from 10 Å to 100 Å.

Figure 3E:
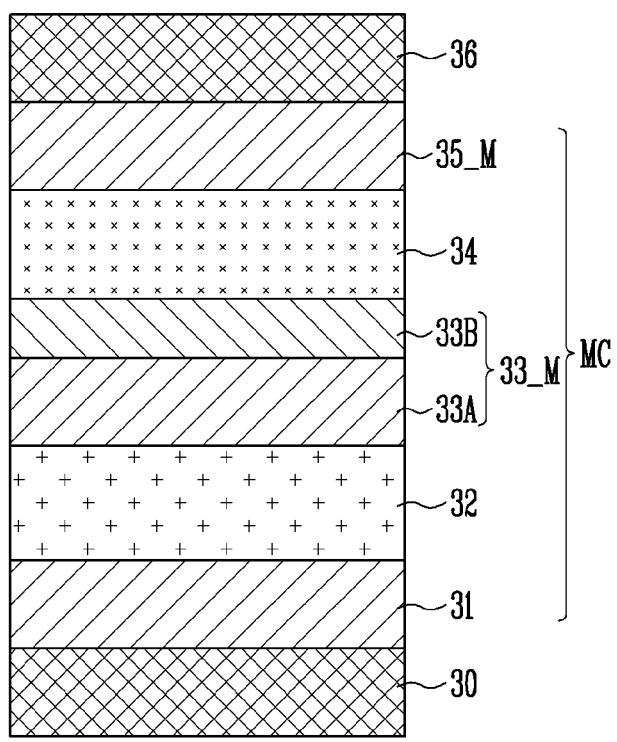

Referring to FIG. 3E, the memory cell MC includes a first electrode 31, a switching layer 32, a second electrode 33_M, a variable resistance layer 34, and a third electrode 35_M. The second electrode 33_M may have a multilayer layer structure and may include a first sub-electrode 33A and a second sub-electrode 33B. The first sub-electrode 33A may be in direct contact with the switching layer 32 and may include a stack of conductive layers. Among the conductive layers included in the first sub-electrode 33A, a conductive layer that is in contact with the switching layer 32 may have a thickness in a range from about 10 Å to about 100 Å. At an interface between the first sub-electrode 33A and the second sub-electrode 33B, a surface of the first sub-electrode 33A may be an etched surface. The second sub-electrode 33B may include an electrode material deposited on the etched surface, and may have a single layer structure.

Figure 3F:
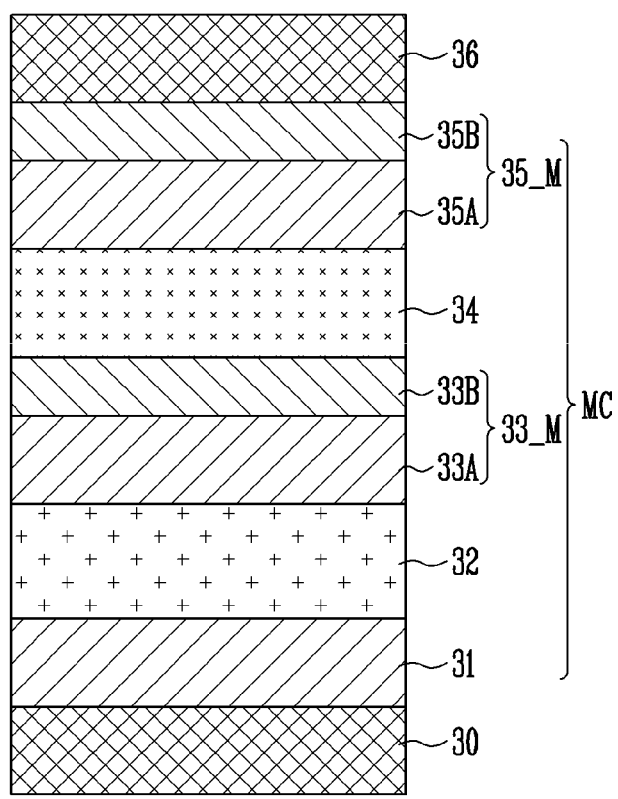

Referring to FIG. 3F, the memory cell MC includes a first electrode 31, a switching layer 32, a second electrode 33_M, a variable resistance layer 34, and a third electrode 35_M. The second electrode 33_M may include a first sub-electrode 33A and a second sub-electrode 33B. The third electrode 35_M may include a third sub-electrode 35A and a fourth sub-electrode 35B. The third sub-electrode 35A may be in direct contact with the variable resistance layer 34 and may include a stack of conductive layers. Among the conductive layers included in the third sub-electrode 35A, a conductive layer that is in contact with the variable resistance layer 34 may have a thickness in a range from 10 Å to 100 Å. At an interface between the third sub-electrode 35A and the fourth sub-electrode 35B, a surface of the third sub-electrode 35A may be an etched surface. The fourth sub-electrode 35B may include an electrode material deposited on the etched surface, and may have a single layer structure.

In the embodiments of FIGS. 3A to 3F, the first electrode 31 is positioned at a lower portion of the memory cell MC and the second electrode 33_M is positioned at an upper portion of the memory cell MC. In other embodiments, the first electrode 31 may be positioned at an upper portion of the memory cell MC and the second electrode 33_M may be positioned at a lower portion of the memory cell MC. In addition, when the electrode is formed so as to include a stack of conductive layers, an interface between an adjacent pair of the conductive layers may be maintained or substantially eliminated in a process of manufacturing.

FIGS. 4A, 4B, 4C, and 4D are diagrams illustrating a method of manufacturing an electronic device according to an embodiment of the present disclosure.

Figure 4A:
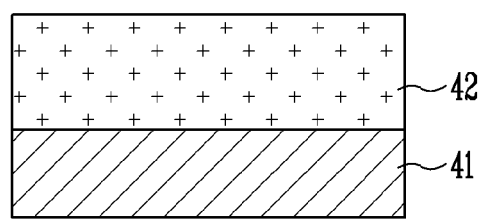
FIGS. 4A, 4B, 4C, and 4D are diagrams illustrating a method of manufacturing an electronic device according to an embodiment of the present disclosure.

Referring to FIG. 4A, a first active layer is formed on a first electrode layer 41. The first active layer may be configured as a switching layer (or a switching material layer) 42. The switching layer 42 may include a chalcogenide based material and may include Te, Se, Ge, Si, As, Ti, S, Sb, and the like.

When the switching layer 42 includes a group 4 element, wrong bonding may be formed between the constituent elements in the switching layer 42. For example, the switching layer 42 may include the group 4 element Ge and a group 6 element Se, pyramid bonding may be formed therebetween. In this case, a drift (e.g., a threshold switching voltage drift) may be increased and a leakage current may be increased.

Therefore, according to an embodiment of the present disclosure, a concentration of the group 4 element (for example, Ge) included in the switching layer 42 is reduced to address the above-described issues. For example, the concentration of the group 4 element included in the switching layer 42 may be 5% to 25%.

Meanwhile, a mean coordination number (MCN) of each element of the switching layer 42 affects a thin layer characteristic of the switching layer 42. When the concentration of the group 4 element included in the switching layer 42 is reduced and the concentration of the group 6 element included in the switching layer 42 is increased, the MCN is reduced. When the MCN is reduced, the switching layer 42 becomes floppy. Therefore, when the concentration of the group 4 element included in the switching layer 42 is reduced, the MCN is reduced to make the switching layer 42 relatively floppy, thereby weakening thermal stability of the switching layer 42 in a fabrication process of a memory cell including the switching layer 42.

Figure 4B:
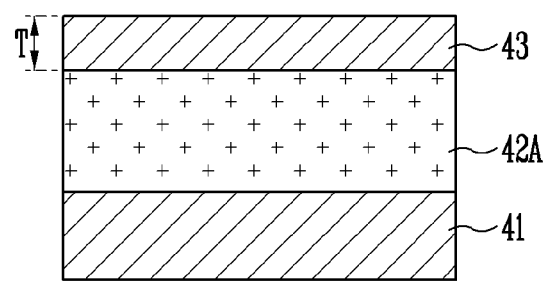
Figure 4C:
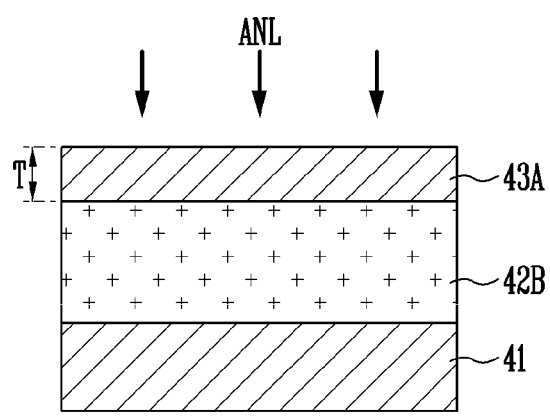
Figure 4D:
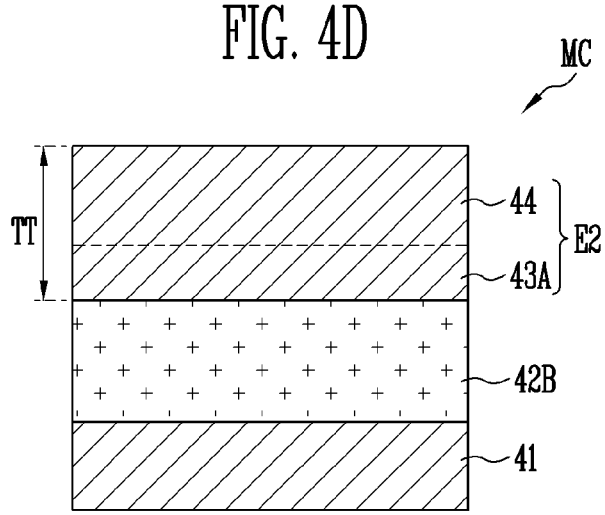

Referring to FIGS. 4B to 4D, a second electrode (or a second electrode layer) E2 is formed on the switching material layer 42. However, in a process of forming the second electrode E2, the switching layer 42 may be damaged. As described above, the drift, the leakage current, and the like may be improved by reducing the concentration of the group 4 element in the switching layer 42. However, since the thermal stability of the switching layer 42 becomes relatively weak and the switching layer 42 may become relatively floppy, the switching layer 42 may be vulnerable to stress due to the second electrode E2. As a result, the switching layer 42 may be damaged in the process of forming the second electrode E2 over the switching layer 42. For example, one or more voids may be generated inside the switching layer 42, at an interface between the switching layer 42 and the second electrode E2, and at an interface between the switching layer 42 and the first electrode layer 41. When the voids are generated, a leakage current may be increased, a threshold voltage may be reduced, or a drift may be increased. In addition, when a size of the void is excessively large, the switching layer 42 may not properly perform a switching operation.

Therefore, in an embodiment of the present disclosure, a process of forming the second electrode E2 is divided into a plurality of sub-processes in order to minimize the damage of the switching layer 42. In addition, in the sub-processes of forming the second electrode E2, a heat treatment process for curing the damage of the switching layer 42 is performed together. For example, the second electrode E2 having a target thickness TT is formed by alternately performing a deposition process of an electrode material layer and a heat treatment process on the electrode material layer.

A forming method of the second electrode layer E2 will be described as follows.

First, referring to FIG. 4B, a first electrode material (or a first electrode material layer) 43 is formed on the switching layer 42. The first electrode material 43 may be formed to be in direct contact with the switching layer 42. The first electrode material 43 may be a part of the second electrode E2. The switching layer 42 may be damaged in a process of forming the first electrode material 43, and the damaged switching layer (or damaged switching material layer) 42A may include one or more voids.

A thickness T of the first electrode material 43 may be determined in consideration of a shape of the deposited layer and the degree of the damage in the damaged switching layer 42A. When the thickness T is too thin, the first electrode material 43 grows in an island shape. Thus, the first electrode material 43 is deposited at a thickness sufficiently large to have a thin layer shape that substantially entirely covers the switching layer 42A. On the contrary, when the thickness T is too thick, the switching layer 42A may be damaged to a degree at which the switching layer 42A may not be sufficiently cured in the process of forming the first electrode material 43. For example, one or more voids may remain in the damaged switching layer 42A even after the heat treatment process on the first electrode material 43 has been completed. For example, damage such as breakdown of an element bond in the switching layer 42A may occur due to ion bombardment, RF power, or the like. Therefore, the thickness T of the first electrode material 43 is adjusted so that the first electrode material 43 is deposited in the thin layer shape and the switching layer 42A is damaged during the deposition process to a degree at which the switching layer 42A may be sufficiently recovered during a subsequent heat treatment process. In consideration of this point, the first electrode material 43 may be formed to have a thickness in a range from 10 Å to 100 Å.

Next, referring to FIG. 4C, the first electrode material 43 is heat-treated. When the first electrode material 43 is heat-treated, the damaged switching layer 42A may be heat-treated together. By recovering, the void in the damaged switching layer 42A may disappear, the number of voids may be reduced, or the size of the void may be reduced. Therefore, a heat-treated first electrode material (or a heat-treated first electrode material layer) 43A and a recovered switching layer (or a recovered switching material layer) 42B are formed.

A condition of the heat treatment process may be determined in consideration of the recovering of the switching layer 42B. When a temperature of the heat treatment process is too low, there is no significant recovering effect, and when the temperature is too high, a surface roughness of the heat-treated first electrode material 43A may be increased. Therefore, the heat treatment process may be performed at a temperature that is sufficient to substantially remove the void from the switching layer 42B and sufficient not to increase the surface roughness of the heat-treated first electrode material 43A. For example, the heat treatment process may be performed at a temperature in a range from 100° C. to 350° C. When a time interval of the heat treatment process is too short, there is no significant recovering effect, and when the time is too long, the surface roughness of the heat-treated first electrode material 43A may be increased. Therefore, the heat treatment process may be performed during a time interval (e.g., from 1 minute to 20 minutes) that is sufficient to substantially remove the void from the switching layer 42B and sufficient not to increase the surface roughness of the heat-treated first electrode material 43A. In addition, a pressure of the heat treatment process is in a range from 0.1 mTorr to 10 mTorr, and the heat treatment process may be performed in an Ar atmosphere, an $N_2$ atmosphere, or a vacuum. For example, after depositing a carbon electrode layer that has a thickness T of about 50 Å on the switching layer 42B, the heat treatment process is performed at a temperature of about 300° C. and at a pressure of about 0.9 mT in an argon (Ar) atmosphere for about 5 minutes.

Next, referring to FIG. 4D, a second electrode material (or a second electrode material layer) 44 is formed on the heat-treated first electrode material 43A. Therefore, the second electrode E2 having the target thickness TT is formed.

When forming the second electrode material 44, the first electrode material 43A may serve as a protective layer of the recovered switching layer 42B. Therefore, damage of the switching layer 42B may be prevented in a process of forming the second electrode material 44. In addition, an interface (indicated by a dotted line) between the first electrode material 43A and the second electrode material 44 may be maintained or extinguished in a subsequent process.

Next, although not shown in the figure, an additional process for patterning the first electrode layer 41, the switching layer 42B, and the second electrode E2 may be performed to form a memory cell (e.g., the memory cell MC in FIG. 3A). Therefore, a memory cell including a first electrode (e.g., the first electrode 31 in FIG. 3A), a switching layer (e.g. the switching layer 32 in FIG. 3A), and a second electrode (e.g., the second electrode 33_M in FIG. 3A) may be formed.

According to the above-described manufacturing method, the damage of the switching layer 42B may be recovered and then substantially prevented in the process of forming the second electrode E2. Therefore, issues (e.g., a drift and a leakage current) may be addressed by reducing the concentration of the group 4 element included in the switching layer 42B, and thermal stability of the switching layer 42B may be improved.

Figure 5A:
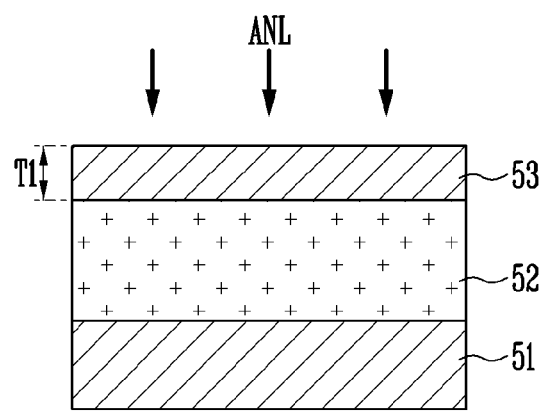
FIGS. 5A, 5B, and 5C are diagrams illustrating a method of manufacturing an electronic device according to an embodiment of the present disclosure.
Figure 5B:
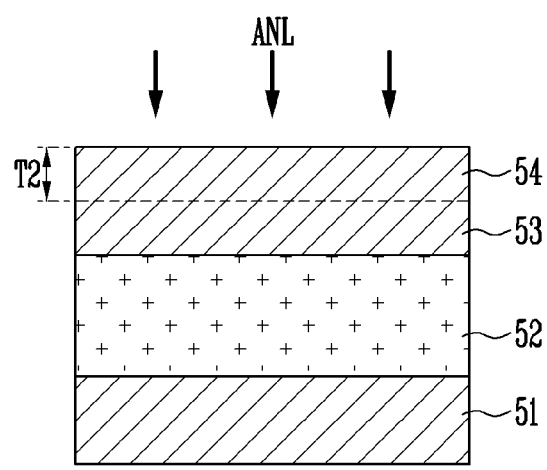
Figure 5C:
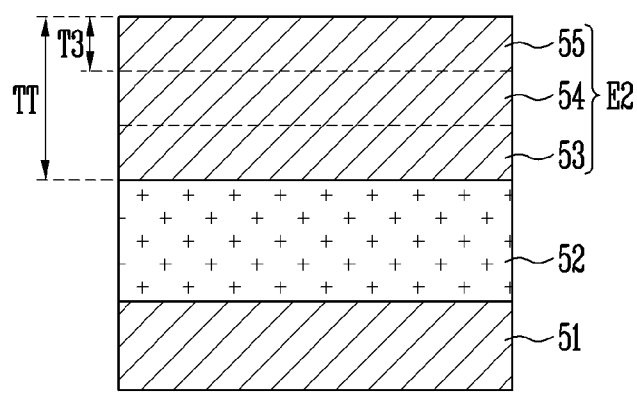

FIGS. 5A, 5B, and 5C are diagrams illustrating a method of manufacturing an electronic device according to an embodiment of the present disclosure. Hereinafter, descriptions repetitive to the above description will be omitted.

Referring to FIG. 5A, an active layer is formed on a first electrode layer 51, and then a first electrode material (or a first electrode material layer) 53 is formed on the active layer. The active layer may be configured as a switching layer (or a switching material layer) 52. A first thickness T1 of the first electrode material 53 may be in a range from 10 Å to 100 Å. The switching layer 52 may be damaged in the process of forming the first electrode material 53.

Next, the first electrode material 53 and the switching layer 52 are heat-treated. Therefore, the damaged switching layer 52 is recovered.

Referring to FIG. 5B, a second electrode material (or a second electrode material layer) 54 is formed on the heat-treated first electrode material 53. The second electrode material 54 may have substantially the same thickness as the first electrode material 53 or may have a thickness different from that of the first electrode material 53. The thickness T2 of the second electrode material 54 may be in a range from 10 Å to 100 Å.

Next, the second electrode material 54 is heat-treated.

Referring to FIG. 5C, a third electrode material (or a third electrode material layer) 55 is formed on the heat-treated second electrode material 54. Therefore, the second electrode E2 having the target thickness TT is formed. The third electrode material 55 may have substantially the same thickness as the first electrode material 53 or may have a thickness different from that of the first electrode material 53. The thickness T3 of the third electrode material 55 may be in a range from 10 Å to 100 Å. Next, although not shown in the figure, a third heat treatment process may be performed on the third electrode material 55, and then an additional process for patterning the first electrode layer 51, the switching layer 52, and the second electrode E2 may be performed to form a memory cell (e.g., the memory cell MC in FIG. 3A).

Figure 6A:
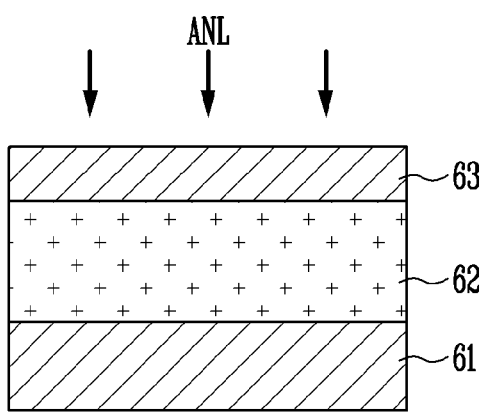
FIGS. 6A, 6B, 6C, and 6D are diagrams illustrating a method of manufacturing an electronic device according to an embodiment of the present disclosure.
Figure 6B:
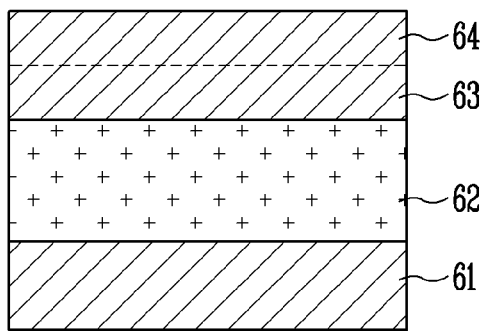
Figure 6C:
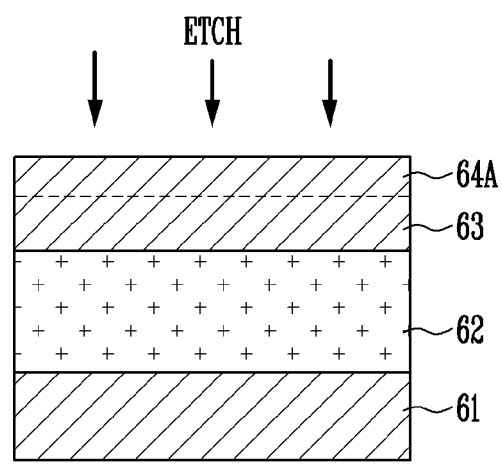

FIGS. 6A, 6B, and 6C are diagrams illustrating a method of manufacturing an electronic device according to an embodiment of the present disclosure. Hereinafter, descriptions repetitive to the above description will be omitted.

Referring to FIG. 6A, an active layer is formed on a first electrode layer 61, and then a first electrode material (or a first electrode material layer) 63 is formed on the active layer. The active layer may be configured as a switching layer (or a switching material layer) 62. For example, the first electrode material 63 has a thickness in a range from 10 Å to 100 Å. Next, the first electrode material 63 and the switching layer 62 are heat-treated. Therefore, the damaged switching layer 62 is recovered.

Referring to FIG. 6B, a second electrode material (a second electrode material layer) 64 is formed on the heat-treated first electrode material 63.

Referring to FIG. 6C, a surface of the second electrode material 64A is etched. For example, an upper portion of the second electrode material 64A is etched using argon gas. Therefore, a surface roughness of the second electrode material 64A is reduced.

Figure 6D:
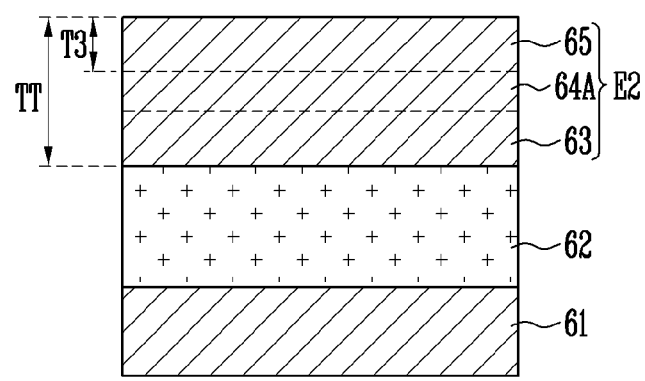

Referring to FIG. 6D, a third electrode material (or a third electrode material layer) 65 is formed on the second electrode material 64A. The third electrode material 65 may be deposited on the etched surface of the second electrode material 64A. A thickness T3 of the third electrode material 65 may be determined in consideration of the etch thickness and the target thickness TT of the second electrode material 64A. The thickness T3 of the third electrode material 65 may be determined so as to compensate for the etched thickness of the second electrode material 64A. Therefore, the second electrode E2 having the target thickness TT is formed.

In another embodiment, the third electrode material 65 may be omitted. In this case, the second electrode E2 includes the first electrode material 63 having a heat-treated surface and the second electrode material 64A having the etched surface with reduced roughness.

FIGS. 7A to 7D are diagrams illustrating a method of manufacturing an electronic device according to an embodiment of the present disclosure. Hereinafter, descriptions repetitive to the above description will be omitted.

Figure 7A:
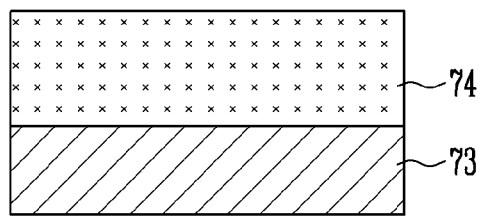
FIGS. 7A, 7B, 7C, and 7D are diagrams illustrating a method of manufacturing an electronic device according to an embodiment of the present disclosure.

Referring to FIG. 7A, an active layer is formed on a first electrode layer 73. The active layer may be configured as a variable resistance layer (or a variable resistance material layer) 74. The variable resistance layer 74 may be a chalcogenide based material including silicon (Si), germanium (Ge), antimony (Sb), tellurium (Te), bismuth (Bi), indium (In), tin (Sn), selenium (Se), or a combination thereof. For example, the variable resistance layer 74 may be Ge—Sb—Te (GST), and may be $Ge_2Sb_2Te_5$, $Ge_2Sb_2Te_7$, $Ge_1Sb_2Te_4$, $Ge_1Sb_4Te_7$, or the like.

Figure 7B:
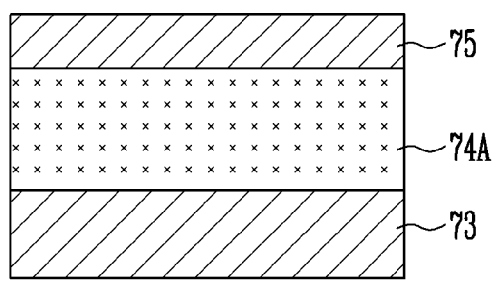

Referring to FIG. 7B, a first electrode material (or a first electrode material layer) 75 is formed on the variable resistance layer 74. A thickness T1 of the first electrode material 75 may be in a range from 10 Å to 100 Å. The variable resistance layer 74 may be damaged in a process of forming the first electrode material 75, and the damaged variable resistance layer (or damaged variable resistance material layer) 74A may include one or more voids.

Figure 7C:
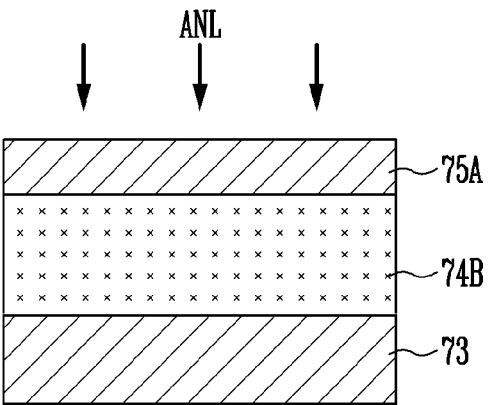

Referring to FIG. 7C, the first electrode material 75 and the damaged variable resistance layer 74A are heat-treated. Therefore, a heat-treated first electrode material (or heat-treated first electrode material layer) 75A is formed, and the damaged variable resistive layer 74A is recovered to form a recovered variable resistance layer (or recovered variable resistance material layer) 74B.

Figure 7D:
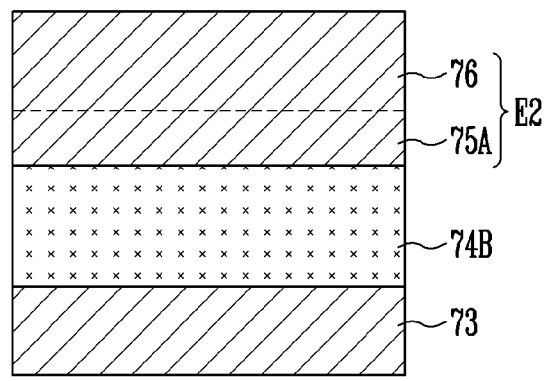

Referring to FIG. 7D, a second electrode material (or second electrode material layer) 76 is formed on the first electrode material 75A. Therefore, the second electrode (or second electrode layer) E2 is formed. The second electrode material 76 may have substantially the same thickness as the first electrode material 75A or have a thickness different from that of the first electrode material 75A. A thickness T2 of the second electrode material 76 may be in a range from 10 Å to 100 Å.

After the second electrode material 76 is formed, an additional process may be performed. In an embodiment, the second electrode material 76 may be heat-treated. In addition, a third electrode material layer (not shown) may be formed after the second electrode material 76 is heat-treated. In an embodiment, a surface of the second electrode material 76 may be etched. In addition, a third electrode material may be formed after the surface of the second electrode material 76 is etched.

Figure 8A:
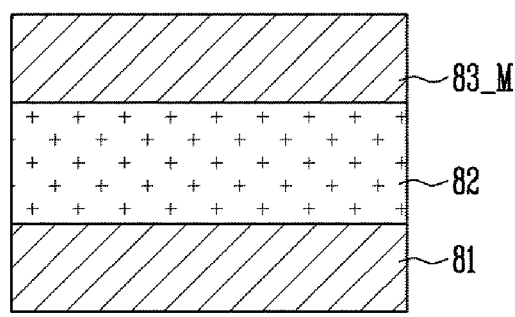
FIGS. 8A and 8B are diagrams illustrating a method of manufacturing an electronic device according to an embodiment of the present disclosure.
Figure 8B:
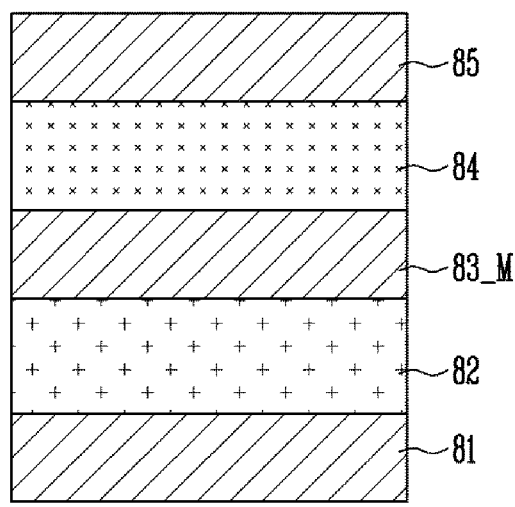

FIGS. 8A and 8B are diagrams illustrating a method of manufacturing an electronic device according to an embodiment of the present disclosure. Hereinafter, descriptions repetitive to the above description will be omitted.

Referring to FIG. 8A, a first active layer is formed on a first electrode layer (or a first electrode material layer) 81, and then a second electrode layer (or a second electrode material layer) 83_M is formed on the first active layer. The first active may be configured as a switching layer (or a switching material layer) 82. Referring to FIG. 8B, after a second active layer is formed on the second electrode layer 83_M, a third electrode layer (or a third electrode material layer) 85 is formed on the second active layer. The second active layer may be configured as a variable resistance layer (or a variable resistance material layer) 84.

One or both of the second electrode layer 83_M and the third electrode layer 85 may have a multi-layer structure. The second electrode layer 83_M in FIG. 8A may be formed in substantially the same manner as the above-described processes to form the second electrode E2 of FIG. 4D, the second electrode E2 of FIG. 5C, the second electrode E2 of FIG. 6D, or a combination thereof. The third electrode layer 85 in FIG. 8B may be formed in substantially the same manner as the above-described processes to form the second electrode E2 of FIG. 4D, the second electrode E2 of FIG. 5C, the second electrode E2 of FIG. 6D, the second electrode E2 of FIG. 7D, or a combination thereof.

Figure 9:
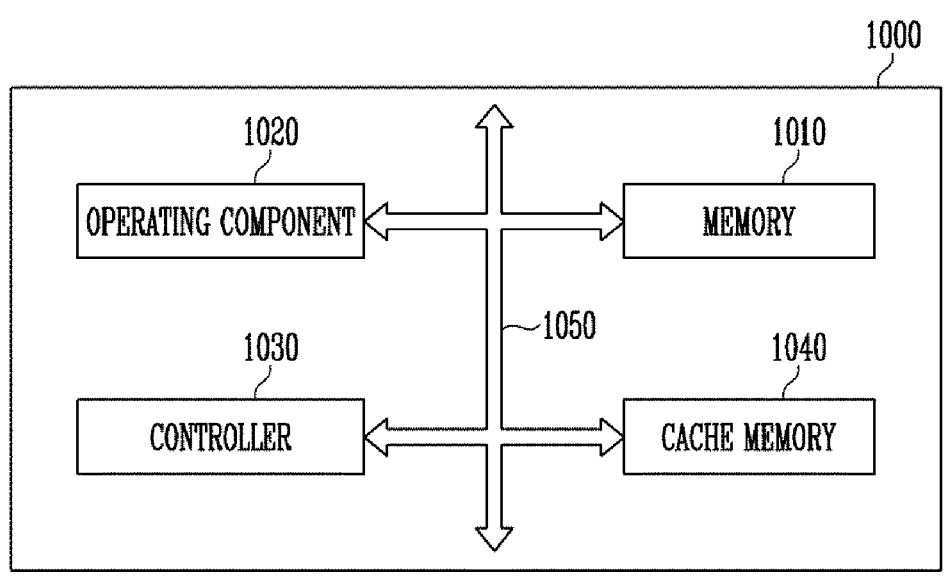
FIG. 9 is a configuration diagram of a microprocessor implementing a memory device according to an embodiment of the present disclosure.

FIG. 9 is a configuration diagram of a microprocessor implementing a memory device according to an embodiment of the present disclosure.

Referring to FIG. 9, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include a data register, an address register, a floating point register, and the like, and may further include various registers. The memory 1010 may temporarily store addresses at which data for performing an operation in the operating component 1020, data of a result of the performance, and data for the performance are stored.

The memory 1010 may include one or more embodiments of the electronic device described above. For example, the memory 1010 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the memory 1010 may be improved. As a result, a read operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from an external device such as the memory 1010, the operating component 1020, and the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 10:
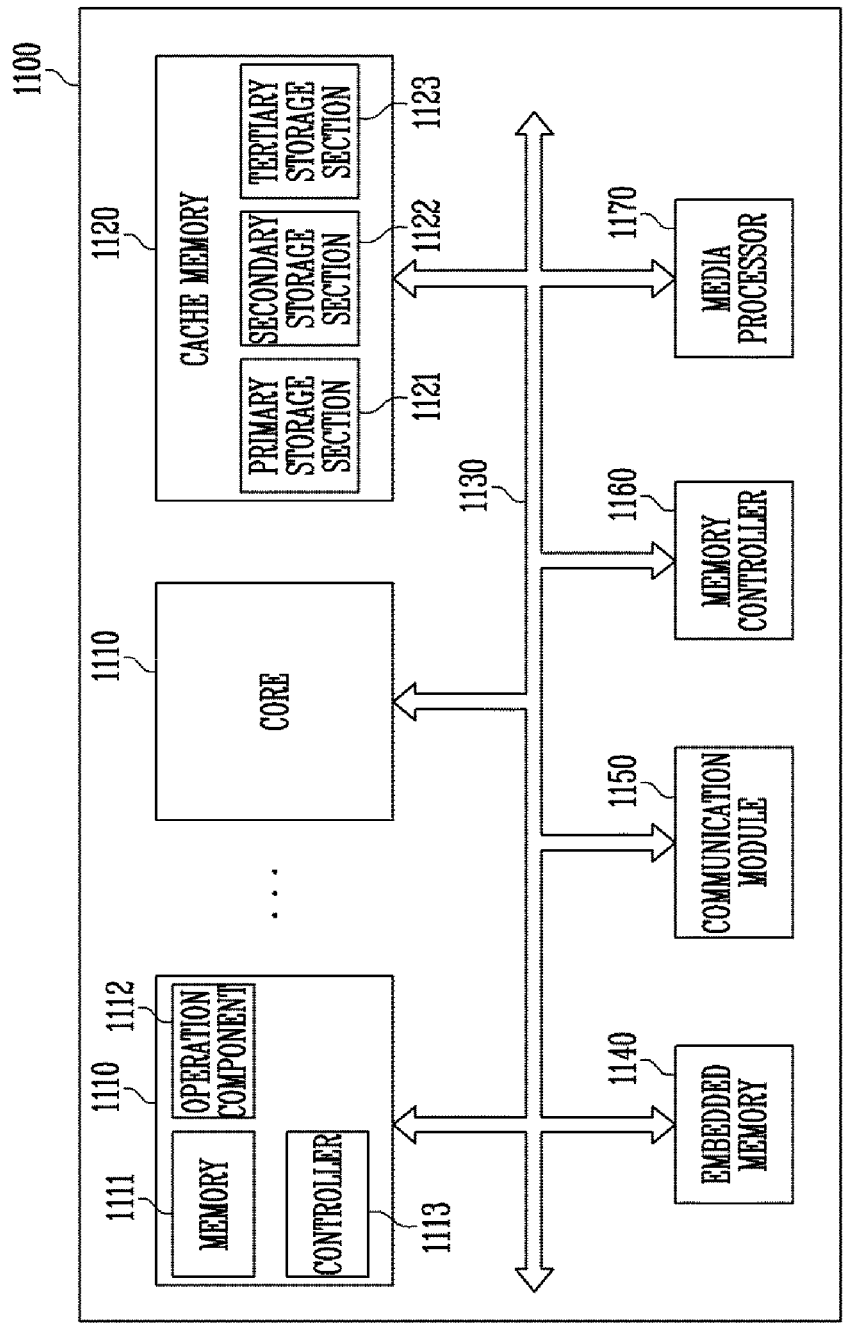
FIG. 10 is a configuration diagram of a processor implementing a memory device according to an embodiment of the present disclosure.

FIG. 10 is a configuration diagram of a processor implementing a memory device according to an embodiment of the present disclosure.

Referring to FIG. 10, the processor 1100 may include various functions in addition to the functions of a microprocessor for controlling and adjusting a series of processes of receiving data from various external devices, processing the data, and transmitting a result of the process to the external device, and thus performance improvement and multi-function may be implemented. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113.

The memory 1111 may be a processor register, a register, or the like, may store data in the processor 1100, may include a data register, an address register, a floating point register, and the like, and may further include various registers. The memory 1111 may temporarily store addresses at which data for performing an operation in the operating component 1112, data of a result of the performance, and data for the performance are stored. The operating component 1112 may be a part performing an operation in the processor 1100, and may perform various arithmetic operations, logical operations, and the like according to a result obtained by decoding an instruction by the controller 1113. The operating component 1112 may include one or more arithmetic and logic units (ALUs) and the like. The controller 1113 may receive a signal from an external device such as the memory 1111, the operating component 1112, and the processor 1100, perform extraction or decoding of an instruction, control of a signal input/output of the processor 1000, and the like, and execute a process indicated by a program.

The cache memory 1120 temporarily stores data to compensate for a data process speed difference between the core 1110 operating at a high speed and an external device operating at a low speed. The cache memory 1120 may include a primary storage 1121, a secondary storage 1122, and a tertiary storage 1123. In general, the cache memory 1120 includes the primary storage 1121 and the secondary storage 1122, and may include the tertiary storage 1123 when a high capacity is required. The cache memory 1120 may include more storages as needed. That is, the number of storages included in the cache memory 1120 may vary depending on design. Here, process speeds for storing and discriminating data in the primary, secondary, and tertiary storages 1121, 1122, and 1123 may be the same or different. When the process speeds of each storage are different, the speed of the primary storage may be the fastest. One or more of the primary storage 1121, the secondary storage 1122, and the tertiary storage 1123 of the cache memory 1120 may include one or more embodiments of the electronic device described above. For example, the cache memory 1120 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the cache memory 112 may be improved. As a result, a read operation characteristic of the processor 1100 may be improved.

FIG. 10 shows a case where all of the primary, secondary, and tertiary storages 1121, 1122, and 1123 are configured in the cache memory 1120. However, all of the primary, secondary, and tertiary storages 1121, 1122, and 1123 may be configured outside the core 1110 and compensate for the process speed difference between the core 1110 and the external device. Alternatively, the primary storage 1121 of the cache memory 1120 may be positioned inside the core 1110, and the secondary storage 1122 and the tertiary storage 1123 may be configured outside the core 1110 and thus a function of compensating the process speed difference may be further strengthened. Alternatively, the primary and secondary storages 1121 and 1122 may be positioned inside the core 1110, and the tertiary storage 1123 may be positioned outside the core 1110.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured equally to the core described above. When the processor 1100 includes the plurality of cores 1110, the primary storage 1121 of the cache memory 1120 may be configured in the respective cores 1110 corresponding to the number of the plurality of cores 1110, and the secondary storage 1122 and the tertiary storage 1123 may be configured outside the plurality of cores 1110 to be shared through the bus interface 1130. Here, the process speed of the primary storage 1121 may be faster than the process speeds of the secondary and tertiary storages 1122 and 1123. In another embodiment, the primary storage 1121 and the secondary storage 1122 may be configured in the respective cores 1110 corresponding to the number of the plurality of cores 1110, and the tertiary storage 1123 may be configured outside the plurality of cores 1110 to be shared through the bus interface 1130.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 11:
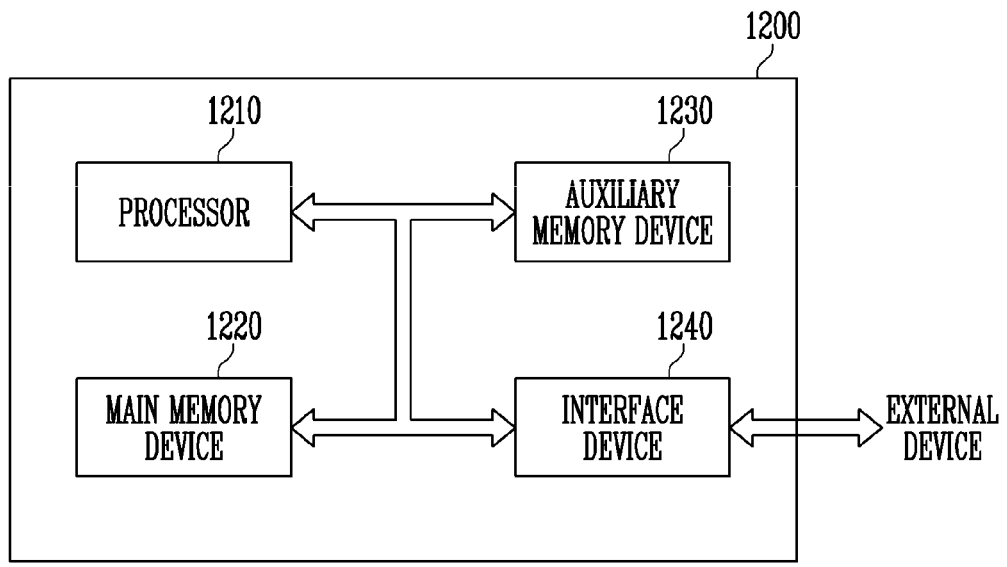
FIG. 11 is a configuration diagram of a system implementing a memory device according to an embodiment of the present disclosure.

FIG. 11 is a configuration diagram of a system implementing a memory device according to an embodiment of the present disclosure.

Referring to FIG. 11, a system 1200 is a device that processes data, and may perform input, process, output, communication, storage, and the like in order to perform a series of operations on data. The system 1200 may include a processor 1210, a main storage device 1220, an auxiliary storage device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200. The processor 1210 may include a microprocessor unit (MPU), a central processing unit (CPU), a single/multi core processor, a graphic processing unit (GPU), an application processor (AP), a digital signal processor (DSP), and the like.

The main storage device 1220 is a storage space capable of moving, storing, and executing a program code or data from the auxiliary storage 1230 when the program is executed. A stored content may be preserved even though power is shut off. The main storage device 1220 may include one or more embodiments of the electronic device described above. For example, the main storage device 1220 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the main storage device 1220 may be improved. As a result, a read operation characteristic of the system 1200 may be improved.

In addition, the main storage device 1220 may further include a static random access memory (SRAM), a dynamic random access memory (DRAM), or the like of a volatile memory type in which all contents are erased when power is turned off. Alternatively, the main storage device 1220 may not include the semiconductor device of the embodiment described above and may further include a static random access memory (SRAM), a dynamic random access memory (DRAM), or the like of a volatile memory type in which all contents are erased when power is turned off.

The auxiliary storage device 1230 refers to a storage device for storing a program code or data. The auxiliary storage device 1230 is slower than the main storage device 1220 but may store a lot of data. The auxiliary storage device 1230 may include one or more embodiments of the electronic device described above. For example, the auxiliary storage device 1230 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the auxiliary storage device 1230 may be improved. As a result, a read operation characteristic of the system 1200 may be improved.

In addition, the auxiliary storage device 1230 may further include a data storage system (refer to 1300 of FIG. 12) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card. Alternatively, the auxiliary storage device 1230 may not include the semiconductor device of the embodiment described above and may include data storage systems (refer to 1300 of FIG. 12) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

Figure 12:
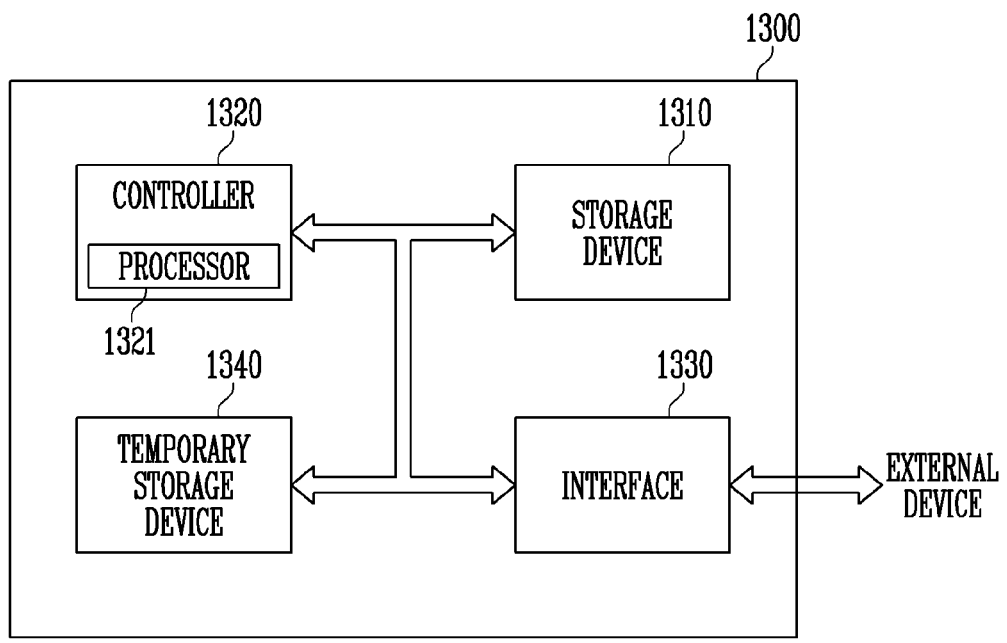
FIG. 12 is a configuration diagram of a data storage system implementing a memory device according to an embodiment of the present disclosure.

FIG. 12 is a configuration diagram of a data storage system implementing a memory device according to an embodiment of the present disclosure.

Referring to FIG. 12, the data storage system 1300 may include a storage device 1310 having a non-volatile characteristic as a configuration for storing data, a controller 1320 that controls the storage device 1310, an interface 1330 for connection with an external device, and a temporary storage device 1340 for temporarily storing data. The data storage system 1300 may be a disk type such as a hard disk drive (HDD), a compact disk read only memory (CDROM), a digital versatile disk (DVD), and a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The storage device 1310 may include a non-volatile memory that semi-permanently stores data. Here, the non-volatile memory may include a read only memory (ROM), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 that performs an operation or the like for processing commands input through the interface 1330 from the outside of the data storage system 1300.

The interface 1330 is for exchanging an instruction, data, and the like between the data storage system 1300 and an external device. When the data storage system 1300 is a card type, the interface 1330 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. When the data storage system 1300 is a disk type, the interface 1330 may be compatible with an interface such as integrated device electronics (IDE), serial advanced technology attachment (SATA), a small computer system interface (SCSI), external SATA (eSATA), personal computer memory card international association (PCM-CIA), and a universal serial bus (USB), or may be compatible with an interface similar to these interfaces. The interface 1330 may be compatible with one or more interfaces having different types.

The temporary storage device 1340 may temporarily store data in order to efficiently transfer data between the interface 1330 and the storage device 1310 according to diversification and high performance of the interface with the external device, the controller, and the system. The temporary storage device 1340 may include one or more embodiments of the electronic device described above. For example, the temporary storage device 1340 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the temporary storage device 1340 may be improved. As a result, a read operation characteristic of the data storage system 1300 may be improved.

Figure 13:
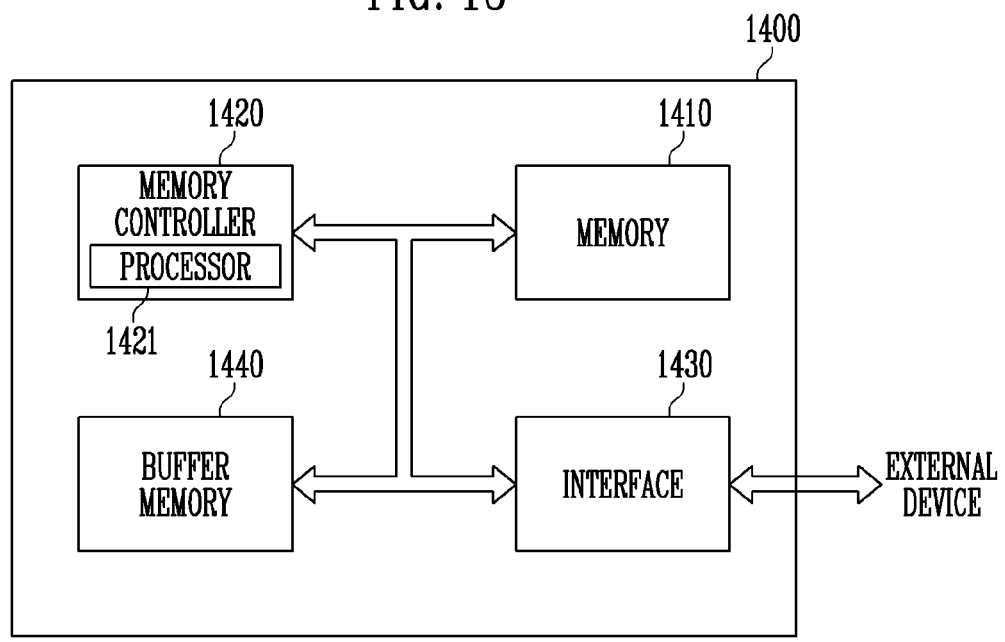
FIG. 13 is a configuration diagram of a memory system implementing a memory device according to an embodiment of the present disclosure.

FIG. 13 is a configuration diagram of a memory system implementing a memory device according to an embodiment of the present disclosure.

Referring to FIG. 13, the memory system 1400 may include a memory 1410 having a non-volatile characteristic as a configuration for storing data, a memory controller 1420 that controls the memory 1410, an interface 1430 for connection with an external device, and the like. The memory system 1400 may be a card type such as a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1410 that stores data may include one or more embodiments of the electronic device described above. For example, the memory 1410 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. Therefore, a read operation characteristic of the memory 1410 may be improved. As a result, a read operation characteristic of the memory system 1400 may be improved.

In addition, the memory of the present embodiment may include a read only memory (ROM), a NOR flash memory, a NAND flash memory, a phase change random access memory (PRAM), a resistive random access memory (RRAM), a magnetic random access memory (MRAM), and the like having a non-volatile characteristic.

The memory controller 1420 may control exchange of data between the memory 1410 and the interface 1430. To this end, the memory controller 1420 may include a processor 1421 for processing and operating commands input through the interface 1430 from the outside of the memory system 1400.

The interface 1430 is for exchanging an instruction, data, and the like between the memory system 1400 and an external device. The interface 1430 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. The interface 1430 may be compatible with one or more interfaces having different types.

The memory system 1400 of the present embodiment may further include a buffer memory 1440 for efficiently transferring input/output of data between the interface 1430 and the memory 1410 according to diversification and high performance of the interface with the external device, the memory controller, and the memory system. The buffer memory 1440 that temporarily stores data may include one or more embodiments of the electronic device described above. For example, the buffer memory 1440 may include a first electrode, a second electrode including a stack of conductive layers, and a first active layer interposed between the first electrode and the second electrode. A conductive layer that is in contact with the first active layer, among the conductive layers of the second electrode may have a thickness of 10 to 100 Å. As a result, a read operation characteristic of the memory system 1400 may be improved.

In addition, the buffer memory 1440 of the present embodiment may further include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like. Alternatively, the buffer memory 1440 may not include the semiconductor device of the embodiment described above, and may include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A method of manufacturing an electronic device including a semiconductor memory, the method comprising:
    forming a first active layer;
    forming a first electrode material over the first active layer;
    performing a heat treatment process on the first electrode material and the first active layer; and
    forming a second electrode material over the heat-treated first electrode material,
    wherein the second electrode material is in direct contact with the first electrode material.
2. The method of claim 1, wherein the first electrode material is in direct contact with the first active layer.
3. The method of claim 1, wherein the heat treatment process is a first heat treatment process, the method further comprising:
    performing a second heat treatment process on the second electrode material; and
    forming a third electrode material over the heat-treated second electrode material.
4. The method of claim 3, wherein the third electrode material is in direct contact with the second electrode material.
5. The method of claim 1, further comprising:
    etching a surface of the second electrode material.
6. The method of claim 5, further comprising:
    forming a third electrode material over an etched surface of the second electrode material.
7. The method of claim 1, wherein one or more voids are generated in the first active layer when the first electrode material is formed, and a number of voids, or a size of each of the voids, or both are reduced by the heat treatment process.
8. The method of claim 1, wherein the first active layer is configured as a switching layer.
9. The method of claim 1, wherein the first active layer is configured as a variable resistance layer.
10. The method of claim 1, wherein the first active layer is configured as a switching layer or a variable resistance layer.
11. The method of claim 1, wherein the heat treatment process is a first heat treatment process, the method further comprising:
    forming a second active layer over the second electrode material;
    forming a third electrode material over the second active layer;
    performing a second heat treatment process on the third electrode material; and
    forming a fourth electrode material over the heat-treated third electrode material.
12. The method of claim 11, further comprising:
    performing a third heat treatment process on the fourth electrode material; and
    forming a fifth electrode material over the heat-treated fourth electrode material.
13. The method of claim 11, further comprising:
    etching a surface of the fourth electrode material.
14. The method of claim 13, further comprising:
    forming a fifth electrode material over an etched surface of the fourth electrode material.
15. The method of claim 11, wherein the first active layer is configured as a switching layer and the second active layer is configured as a variable resistance layer.
16. The method of claim 11, wherein the first active layer is configured as a variable resistance layer and the second active layer is configured as a switching layer.
17. The method of claim 1, wherein a thickness of the first electrode material is in a range from 10 Å to 100 Å.
18. The method of claim 1, wherein the heat treatment is performed at a temperature that reduces a number of voids in the first active layer, or a size of each of the voids, or both.
19. The method of claim 1, wherein the heat treatment process is performed at a temperature in a range from 100° C. to 350° C.
20. The method of claim 1, wherein the heat treatment process is performed during a time interval from 1 minute to 20 minutes.
21. The method of claim 1, wherein the heat treatment process is performed at a pressure of 0.1 mTorr to 10 mTorr.
22. The method of claim 1, wherein the heat treatment is performed in an Ar atmosphere, an $N_2$ atmosphere, or a vacuum.
23. The method of claim 1, wherein a thickness of the first electrode material is in a range from 10 Å to 100 Å, and the heat treatment process is performed at a temperature in a range from 100° C. to 350° C. and a pressure in a range from 0.1 mTorr to 10 mTorr for 1 minute to 20 minutes.
24. An electronic device including a semiconductor memory, wherein the semiconductor memory comprises:
    a first electrode;
    a second electrode including a plurality of conductive layers; and a first active layer interposed between the first electrode and the second electrode, and wherein the plurality of conductive layers of the second electrode include a first conductive layer that is in contact with the first active layer, the first conductive layer having a thickness in a range from 10 Å to 100 Å.

25. The electronic device of claim 24, wherein the first active layer is configured as a switching layer.

26. The electronic device of claim 24, wherein the first active layer is configured as a variable resistance layer.

27. The electronic device of claim 24, wherein the first active layer is configured as a switching layer or a variable resistance layer.

28. The electronic device of claim 24, wherein the plurality of conductive layers of the second electrode are a first plurality of conductive layers, and wherein the semiconductor memory further comprises:
a third electrode including a second plurality of conductive layers; and
a second active layer interposed between the second electrode and the third electrode.

29. The electronic device of claim 28, wherein the second plurality of the conductive layers include a second conductive layer that is in contact with the second active layer, the second conductive layer having a thickness in a range from 10 Å to 100 Å.

30. The electronic device of claim 28, wherein the first active layer is configured as a switching layer and the second active layer is configured as a variable resistance layer.

31. The electronic device of claim 28, wherein the first active layer is configured as a variable resistance layer and the second active layer is configured as a switching layer.

32. The electronic device of claim 24, wherein the second electrode is a carbon electrode.

* * * * *